(12) United States Patent
Fu

(10) Patent No.: US 11,399,436 B2
(45) Date of Patent: Jul. 26, 2022

(54) CIRCUIT BOARD

(71) Applicants: HongQiSheng Precision Electronics (QinHuangDao) Co.,Ltd., Qinhuangdao (CN); Avary Holding (Shenzhen) Co., Limited., Shenzhen (CN)

(72) Inventor: Chih-Chieh Fu, New Taipei (TW)

(73) Assignees: HongQiSheng Precision Electronics (QinHuangDao) Co., Ltd., Qinhuangdao (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 17/027,923

(22) Filed: Sep. 22, 2020

(65) Prior Publication Data

US 2021/0007226 A1    Jan. 7, 2021

Related U.S. Application Data

(62) Division of application No. 16/231,997, filed on Dec. 25, 2018, now Pat. No. 10,827,623.

(30) Foreign Application Priority Data

Sep. 27, 2018 (CN) .......................... 201811133481.8

(51) Int. Cl.
*H05K 3/10* (2006.01)
*H05K 1/11* (2006.01)
(Continued)

(52) U.S. Cl.
CPC .............. *H05K 3/107* (2013.01); *H05K 1/09* (2013.01); *H05K 1/115* (2013.01); *H05K 3/0011* (2013.01);
(Continued)

(58) Field of Classification Search
CPC ........ H05K 1/09; H05K 1/115; H05K 3/0011; H05K 3/107; H05K 3/108; H05K 3/42;
(Continued)

(56) References Cited

U.S. PATENT DOCUMENTS 5,602,490 A * 2/1997 Blumenau .......... G01R 1/07357
29/705
6,031,728 A * 2/2000 Bedos .................... H05K 1/141
174/255

(Continued)

FOREIGN PATENT DOCUMENTS

CN          1560912 A  *  1/2005
JP         3655977 B2  *  6/2005

*Primary Examiner* — Carl J Arbes
(74) *Attorney, Agent, or Firm* — ScienBiziP, P.C.

(57) ABSTRACT

A circuit board includes a baseboard, a first conductive circuit layer, a second conductive circuit layer, at least one through hole, and a number of conductive lines. The first conductive circuit layer includes a number of first conductive circuit lines formed on a first side of the baseboard. The second conductive circuit layer includes a number of second conductive circuit lines formed on a second side of the baseboard. The through hole is defined through the first conductive circuit layer, the baseboard, and the second conductive circuit layer. The number of conductive lines are formed in an inner wall of the through hole and spaced apart around the through hole. Each conductive line electrically couples one of the first conductive circuit lines to a corresponding one of the second conductive circuit lines.

6 Claims, 6 Drawing Sheets

(51) Int. Cl.
*H05K 3/00* (2006.01)
*H05K 3/42* (2006.01)
*H05K 3/46* (2006.01)
*H05K 1/09* (2006.01)

(52) U.S. Cl.
CPC ............. *H05K 3/42* (2013.01); *H05K 3/4644* (2013.01); *H05K 3/108* (2013.01); *H05K 2201/09036* (2013.01); *H05K 2203/107* (2013.01)

(58) Field of Classification Search
CPC ....... H05K 3/4644; H05K 2201/09036; H05K 2203/107
See application file for complete search history.

(56) References Cited

U.S. PATENT DOCUMENTS

| | | | |
|---|---|---|---|
| 7,258,549 B2* | 8/2007 | Asahi ................. | H01R 13/2414 174/255 |
| 7,655,869 B2* | 2/2010 | Kawaguchi .......... | H05K 3/4691 174/254 |
| 9,451,694 B2* | 9/2016 | Huang ................. | H01L 25/071 |

* cited by examiner

CIRCUIT BOARD

CROSS-REFERENCE TO RELATED APPLICATIONS

This is a divisional application of patent application Ser. No. 16/231,997, filed on Dec. 25, 2018, assigned to the same assignee, which is based on and claims priority to China Patent Application No. 201811133481.8 filed on Sep. 27, 2018, the contents of which are incorporated by reference herein.

FIELD

The subject matter herein generally relates to circuit boards, and more particularly to a circuit board adapted for multi-signal transmission.

BACKGROUND

As electronic devices become smaller, circuit boards of the electronic devices are required to be smaller. Thus, a density of signal lines on the circuit board may become denser.

BRIEF DESCRIPTION OF THE DRAWINGS

Implementations of the present disclosure will now be described, by way of embodiments only, with reference to the attached figures.

DETAILED DESCRIPTION

Figure 1:
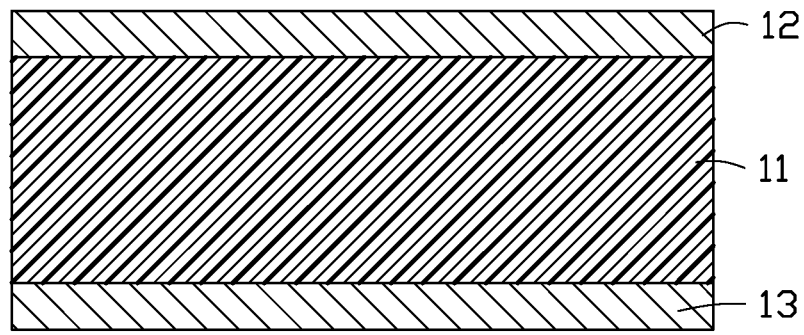
FIG. 1 is a cross-sectional view of a first embodiment of a baseboard of a circuit board.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

FIGS. 1-7 show a first embodiment of a method for making a circuit board 100.

As shown in FIG. 1, a baseboard 10 is provided.

The baseboard 10 is a double-sided board including a base layer 11, a first base copper layer 12 formed on a first side of the base layer 11, and a second base copper layer 13 formed on a second side of the base layer 11, second side being opposite to the first side.

In one embodiment, the base layer 11 is a flexible resin layer, such as polyimide, polyethylene terephthalate, or polyethylene naphthalate.

Figure 2:
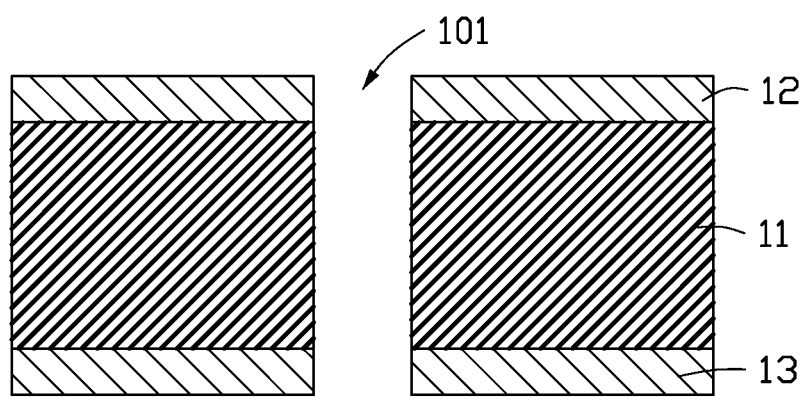
FIG. 2 shows the baseboard in FIG. 1 with a through hole.

As shown in FIG. 2, at least one through hole 101 is defined in the baseboard 10. The through hole 101 passes through the first base copper layer 12, the base layer 11, and the second base copper layer 13 in sequence.

The through hole 101 can be defined by laser processing, machine cutting, or other suitable methods.

Figure 3:
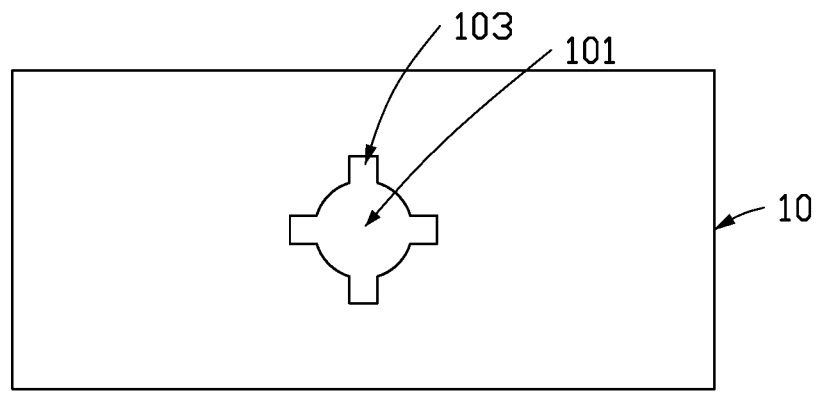
FIG. 3 is a top view of the baseboard in FIG. 2.
Figure 4:
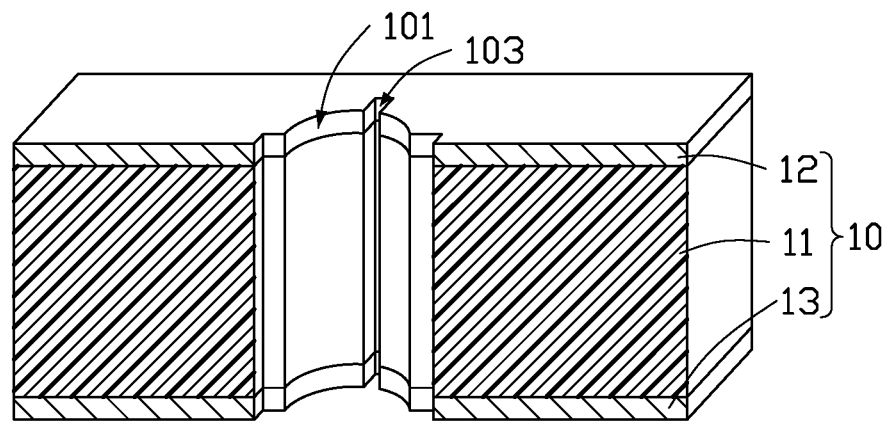
FIG. 4 is an isometric view of the baseboard in FIG. 2.

As shown in FIGS. 3 and 4, a plurality of grooves 103 are defined in an inner wall of the through hole 101. Each of the plurality of grooves 103 passes through the first base copper layer 12, the base layer 11, and the second base copper layer 13 in sequence.

The plurality of grooves 103 can be defined by laser processing, machine cutting, or other suitable methods.

In one embodiment, a quantity of the plurality of grooves 103 is four. The four grooves 103 are equally spaced apart around the through hole 101. In other embodiments, a quantity of the plurality of grooves 103 can be changed according to requirements.

Figure 5:
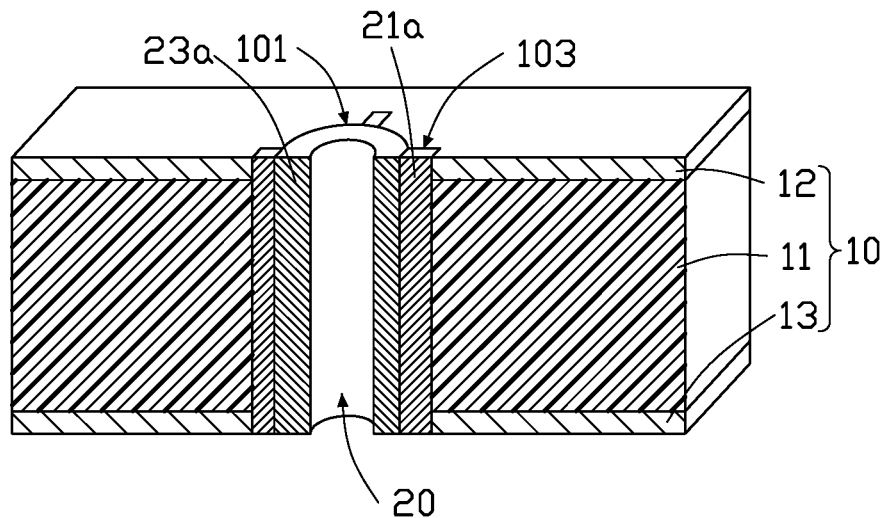
FIG. 5 shows the baseboard in FIG. 4 after metalizing the through hole.

As shown in FIG. 5, the through hole 101 and the plurality of grooves 103 are metalized to form a metal layer 23a on an inner wall of the through hole 101 and fill in the plurality of grooves 103 with metal. The metal layer 23a forms a via 20, and the metal filled in the plurality of grooves 103 forms a plurality of conductive lines 21a. Each of the plurality of conductive lines 21a electrically couples the first base copper layer 12 to the second base copper layer 13.

In other embodiments, a copper layer (not shown) is formed on a surface of the first copper layer 12 and a surface of the second copper layer 13.

Figure 6:
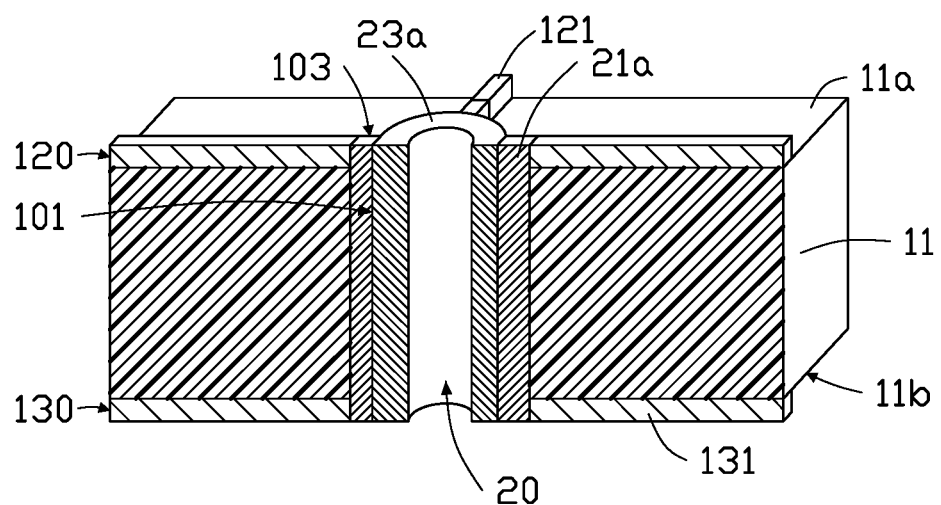
FIG. 6 shows the baseboard in FIG. 5 having a plurality of conductive circuit lines.

As shown in FIG. 6, the first base copper layer 12 is circuit processed to form a first conductive circuit layer 120 from the first base copper layer 12, and the second base copper layer 13 is circuit processed to form a second conductive circuit layer 130 from the second base copper layer 13. The first conductive circuit layer 120 includes a plurality of first conductive circuit lines 121, and the second conductive circuit layer 130 includes a plurality of second conductive circuit lines 131. Each conductive line 21a electrically couples one of the plurality of first conductive circuit lines 121 to a corresponding one of the plurality of second conductive circuit lines 131.

Figure 7:
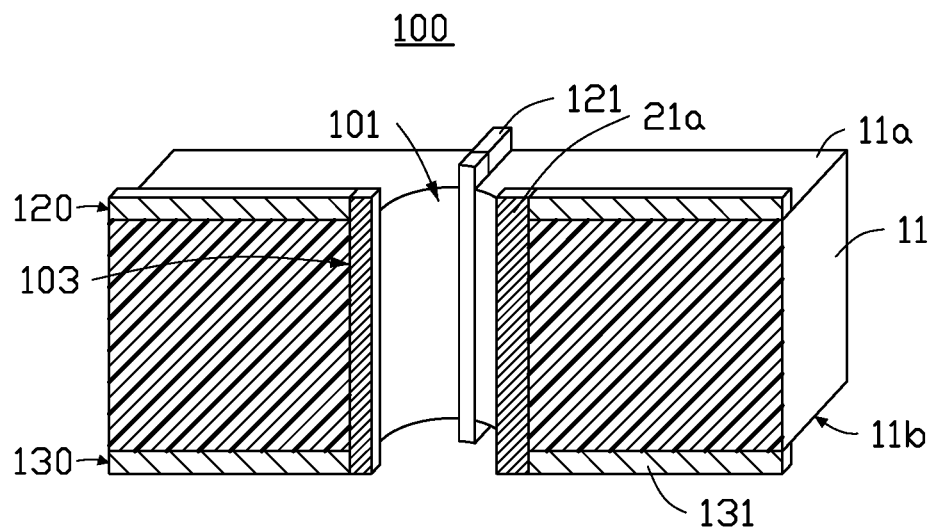
FIG. 7 shows the baseboard in FIG. 6 having a metal layer of the through hole removed.

As shown in FIG. 7, the metal layer 23a is removed from the inner wall of the through hole 101. In one embodiment, the metal layer 23a is removed by machine drilling the via 20. In other embodiments, the metal layer 23a may be removed by laser cutting, etching, or other suitable methods.

FIGS. 8-11 show a second embodiment of a method for making a circuit board 100.

Figure 8:
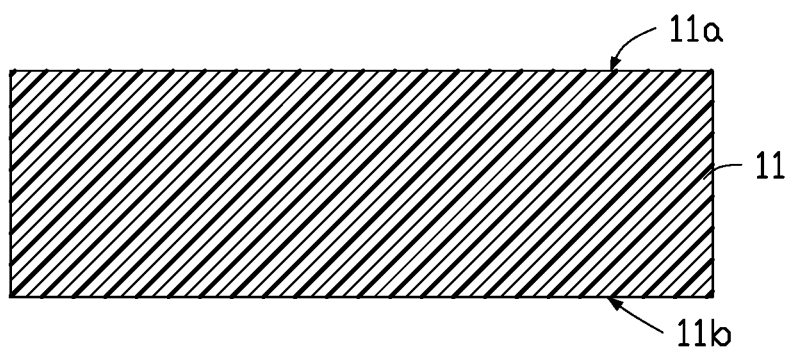
FIG. 8 is a cross-sectional view of a second embodiment of a baseboard of a circuit board.

As shown in FIG. 8, an insulated base layer 11 is provided.

The insulated base layer 11 may be made of polyimide, polyethylene terephthalate, or polyethylene naphthalate.

Figure 9:
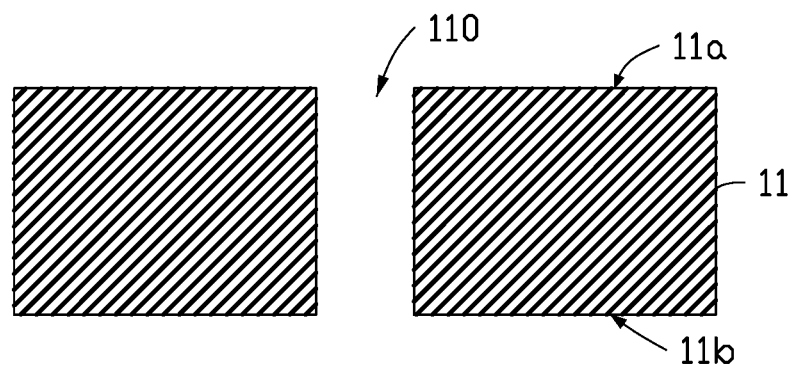
FIG. 9 shows the baseboard in FIG. 8 with a through hole.

As shown in FIG. 9, at least one through hole 110 is defined in the base layer 11. The through hole 110 can be defined by laser processing, machine cutting, or other suitable method.

The insulated base layer 11 includes two opposite surfaces 11a and 11b.

Figure 10:
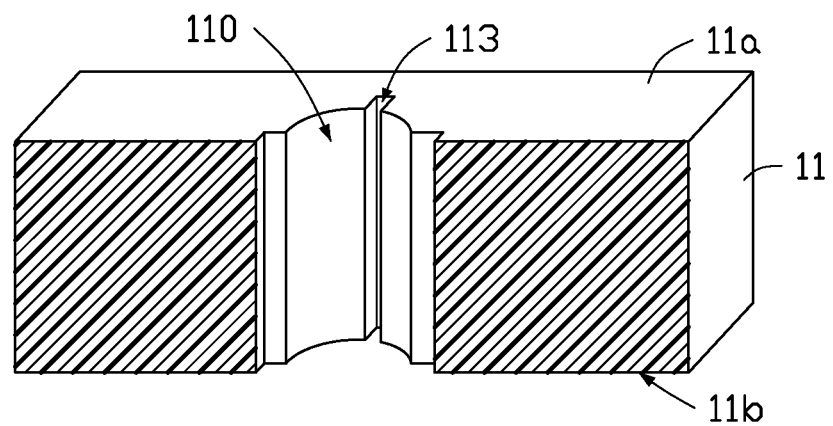
FIG. 10 is an isometric view of the baseboard in FIG. 9.

As shown in FIG. 10, a plurality of via slots 113 are defined in an inner wall of the through hole 110. Each of the plurality of via slots 113 passes through the surfaces 11a, 11b of the insulated base layer 11.

The via slots 113 can be defined by laser processing, machine cutting, or other suitable method.

Figure 11:
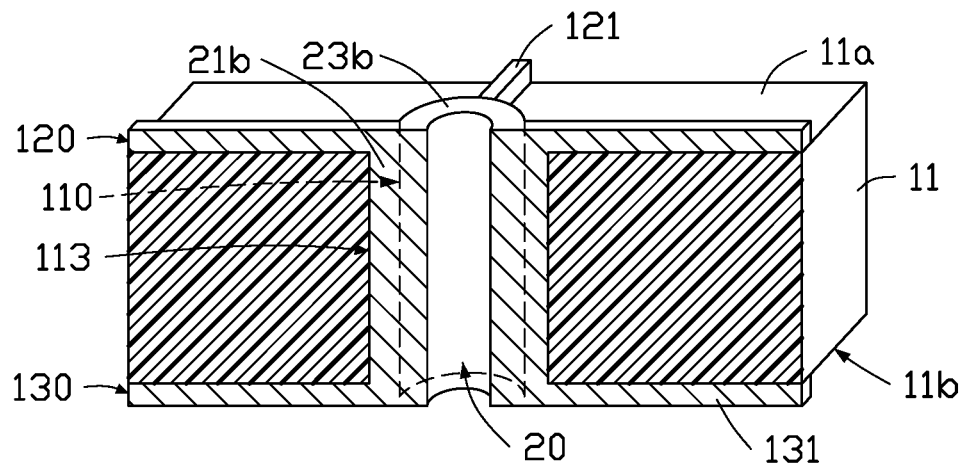
FIG. 11 shows the baseboard in FIG. 10 after metalizing the through hole and forming a plurality of conductive circuit lines.

As shown in FIG. 11, circuits are created on the surface 11a by a fully additive process to form a first conductive circuit layer 120 from the surface 11a, circuit process the surface 11b to form a second conductive circuit layer 130 from the surface 11b, form a conductive line 21b in each of the via slots 113, and a metal layer 23b on an inner wall of the through hole 110. The metal layer 23b forms a via 20. The first conductive circuit layer 120 includes a plurality of first conductive circuit lines 121, and the second conductive circuit layer 130 includes a plurality of second conductive circuit lines 131. Each of the plurality of conductive lines 21b electrically couples one of the first conductive circuit lines 121 to a corresponding one of the second conductive circuit lines 131.

Figure 12:
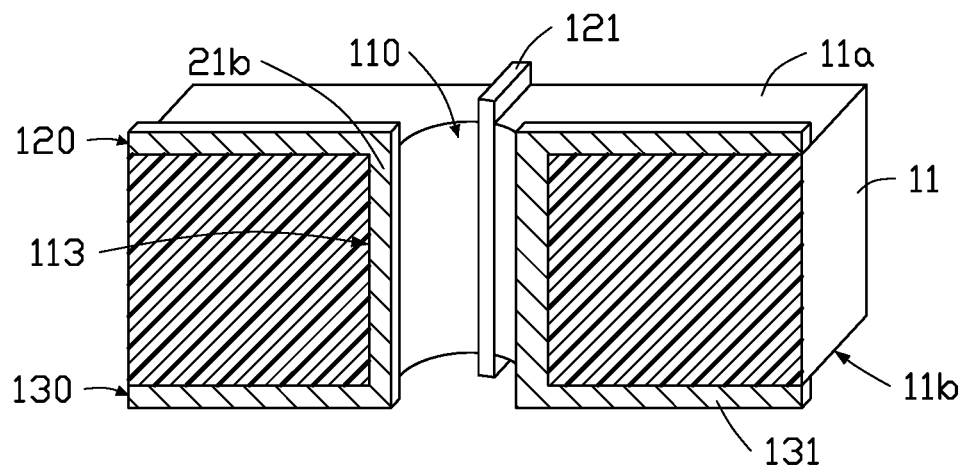
FIG. 12 shows the baseboard in FIG. 11 having a metal layer of the through hole removed.

As shown in FIG. 12, the metal layer 23b is removed from the inner wall of the through hole 110. In one embodiment, the metal layer 23b is removed by a machine drilling process. In other embodiments, the metal layer 23b can be removed by laser cutting, etching, or other suitable method.

In another embodiment, the first conductive circuit layer 120, the second conductive circuit layer 130, the conductive lines 21b, and the via 20 are formed by a semi-additive process.

In another embodiment, the plurality of grooves 103 and/or the plurality of via slots 113 are roughened before being metalized.

As shown in FIG. 7, a circuit board 100 includes a base layer 11, a first conductive circuit layer 120, and a second conductive circuit layer 130. The first conductive circuit layer 120 and the second conductive circuit layer 130 are respectively formed from opposite sides of the base layer 11. The first conductive circuit layer 120 includes a plurality of first conductive circuit lines 121, and the second conductive circuit layer 130 includes a plurality of second conductive circuit lines 131. The circuit board 100 further defines at least one through hole 101. A plurality of conductive lines 21a are formed in an inner wall of each of the through holes 101. Each of the conductive lines 21a electrically couples one of the first conductive circuit lines 121 to a corresponding one of the second conductive circuit lines 131.

As described in the embodiments above, the circuit board 100 includes a plurality of conductive lines 21a (21b) formed in each through hole 101. Each conductive line 21a (21b) electrically couples one of the plurality of first conductive circuit lines 121 to a corresponding one of the plurality of second conductive circuit lines 131 to achieve multi-signal transmission through the same through hole 101. Thus, the circuit board 100 can be made in a small size with a high density of signal transmission.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A circuit board comprising:
    a baseboard;
    a first conductive circuit layer comprising a plurality of first conductive circuit lines on a first side of the baseboard;
    a second conductive circuit layer comprising a plurality of second conductive circuit lines on a second side of the baseboard;
    at least one through hole communicating the first conductive circuit layer, the baseboard, and the second conductive circuit layer, wherein a plurality of grooves are recessed from a circumferential wall of the at least one through hole; and
    a plurality of conductive lines embedded into the plurality of grooves, the plurality of conductive lines being spaced apart surrounding a peripheral of each of the at least one through hole, wherein each of the plurality of conductive lines electrically couples one of the first conductive circuit lines to a corresponding one of the second conductive circuit lines.

2. The circuit board of claim 1, wherein each of the plurality of grooves is roughened.

3. The circuit board of claim 1, wherein the plurality of conductive lines is equally spaced apart surrounding the peripheral of each of the at least one through hole.

4. The circuit board of claim 3, wherein a quantity of the plurality of conductive lines is four.

5. The circuit board of claim 1, wherein the baseboard is flexible resin layer.

6. The circuit board of claim 5, wherein the baseboard is made of polyimide, polyethylene terephthalate, or polyethylene naphthalate.

* * * * *